(12) United States Patent
Pugh et al.

(10) Patent No.: US 10,310,294 B2
(45) Date of Patent: Jun. 4, 2019

(54) THINNED AND FLEXIBLE SEMICONDUCTOR ELEMENTS ON THREE DIMENSIONAL SURFACES

(71) Applicant: Johnson & Johnson Vision Care, Inc., Jacksonville, FL (US)

(72) Inventors: Randall B. Pugh, St. Johns, FL (US); James Daniel Riall, St. Johns, FL (US); Daniel B. Otts, Fruit Cove, FL (US); Adam Toner, Jacksonville, FL (US); Frederick A. Flitsch, New Windsor, NY (US)

(73) Assignee: Johnson & Johnson Vision Care, Inc., Jacksonville, FL (US)

( * ) Notice: Subject to any disclaimer, the term of this patent is extended or adjusted under 35 U.S.C. 154(b) by 228 days.

(21) Appl. No.: 13/946,006

(22) Filed: Jul. 19, 2013

(65) Prior Publication Data

US 2014/0028969 A1 Jan. 30, 2014

Related U.S. Application Data

(60) Provisional application No. 61/674,887, filed on Jul. 24, 2012.

(51) Int. Cl.
*G02C 7/08* (2006.01)
*G02C 7/04* (2006.01)
(Continued)

(52) U.S. Cl.
CPC ........ *G02C 7/083* (2013.01); *B29D 11/00038* (2013.01); *B29D 11/00817* (2013.01); *G02C 7/04* (2013.01); *G02C 7/049* (2013.01); *H05K 1/0284* (2013.01); *H01L 23/04* (2013.01); *H01L 2924/0002* (2013.01); *H05K 2201/10568* (2013.01); *H05K 2201/10583* (2013.01)

(58) Field of Classification Search
CPC .......... G02C 7/08; G02C 7/081; G02C 7/083; G02C 7/085; G02C 7/02–7/04; G02C 7/022; G02B 1/00; G02B 1/04; G02B 1/041; G02B 1/043; A61F 2/16–1637
USPC .... 351/159.04, 159.01–159.81, 178, 159.03, 351/159.39, 159.4; 623/4.1–6.64
See application file for complete search history.

(56) References Cited

U.S. PATENT DOCUMENTS 6,417,027 B1 7/2002 Akram
6,479,890 B1 11/2002 Trieu et al.
(Continued)

FOREIGN PATENT DOCUMENTS

CN 1675582 A 9/2005
EP 1699232 A2 9/2006
(Continued)

OTHER PUBLICATIONS

Examination Report issued by the Intellectual Property Office of Singapore dated Jan. 1, 2015 for Application No. 201305629-6.

*Primary Examiner* — Darryl J Collins
*Assistant Examiner* — Gary W O'Neill

(57) ABSTRACT

Methods to form a device whereon flexible component elements are attached upon three-dimensional surfaces are described. In some aspects, the present invention includes incorporating flexible semiconductor devices onto three-dimensional surfaces with electrical contacts. In some aspects, the formed device may be incorporated in an ophthalmic device.

7 Claims, 12 Drawing Sheets

(51) Int. Cl.
  *H05K 1/02* (2006.01)
  *B29D 11/00* (2006.01)
  *H01L 23/04* (2006.01)

(56) References Cited

U.S. PATENT DOCUMENTS

| | | | |
|---|---|---|---|
| 6,791,072 B1 | 9/2004 | Prabhu | |
| 2008/0157235 A1* | 7/2008 | Rogers | H01L 21/8258 257/415 |
| 2010/0076553 A1* | 3/2010 | Pugh | B29D 11/00038 623/6.22 |
| 2010/0298895 A1* | 11/2010 | Ghaffari | A61B 1/00082 607/3 |
| 2012/0038881 A1* | 2/2012 | Amirparviz | G02C 7/04 351/159.02 |
| 2012/0109296 A1* | 5/2012 | Fan | A61F 2/14 623/6.63 |
| 2012/0157804 A1* | 6/2012 | Rogers | A61B 5/0422 600/345 |

FOREIGN PATENT DOCUMENTS

| | | |
|---|---|---|
| JP | 2012503222 A | 2/2012 |
| JP | 2013514146 A | 4/2013 |
| WO | WO2004019078 A2 | 3/2004 |
| WO | WO2010033679 A2 | 3/2010 |
| WO | WO 10/076553 A1 | 7/2010 |
| WO | WO2010133317 A1 | 11/2010 |
| WO | WO2011084450 A1 | 7/2011 |
| WO | WO2012098398 A1 * | 1/2012 ............. G02C 7/083 |

* cited by examiner

Thinning of
Semiconductor

Thinning of Semiconductor
with Semiconductor on
Oxide Substrates

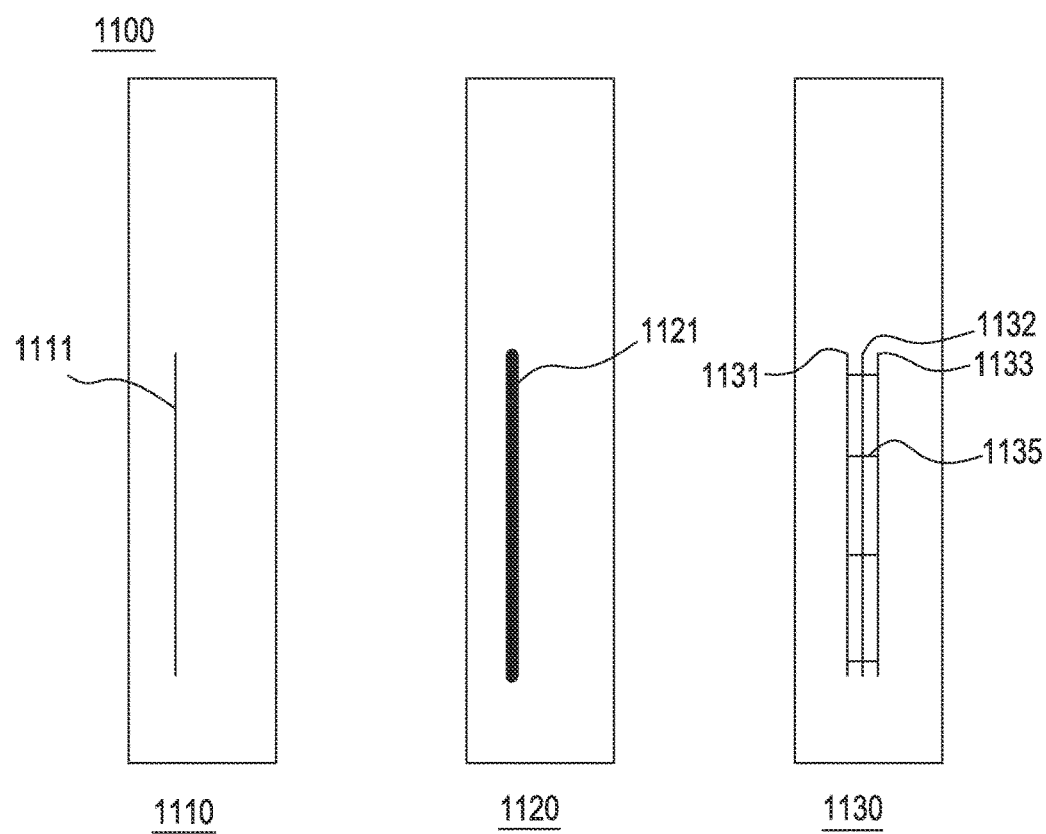

1200

1210

1220

1231  1232

1230

THINNED AND FLEXIBLE SEMICONDUCTOR ELEMENTS ON THREE DIMENSIONAL SURFACES

CROSS REFERENCE TO RELATED APPLICATIONS

The present invention claims the benefit of U.S. Application Ser. No. 61/674,887, filed on Jul. 24, 2012.

BACKGROUND OF THE INVENTION

1. Field of the Invention

The present invention describes methods to form a device that includes flexible semiconductor elements located upon electrical interconnections. More specifically, the flexible semiconductor elements may be deformed or bent in order to attach to three-dimensionally shaped regions. The methods described herein are useful, for example, in the field of energized ophthalmic devices.

2. Discussion of the Related Art

Traditionally an ophthalmic device, such as a contact lens, an intraocular lens or a punctal plug included a biocompatible device with a corrective, cosmetic or therapeutic quality. A contact lens, for example, may provide one or more of vision correcting functionality, cosmetic enhancement, and therapeutic effects. Each function is provided by a physical characteristic of the lens. A design incorporating a refractive quality into a lens may provide a vision corrective function. A pigment incorporated into the lens may provide a cosmetic enhancement. An active agent incorporated into a lens may provide a therapeutic functionality. Such physical characteristics are accomplished without the lens entering into an energized state.

More recently, it has been theorized that active components may be incorporated into a contact lens. Some components may include semiconductor devices. Some examples have shown semiconductor devices embedded in a contact lens placed upon animal eyes. It has also been described how the active components may be energized and activated in numerous manners within the lens structure itself. The topology and size of the space defined by the lens structure creates a novel and challenging environment for the definition of various functionality. In many embodiments, it is important to provide reliable, compact and cost effective means to incorporate components within an ophthalmic device. In some embodiments, it may be advantageous to include components that may be thinned and flexible. As a result, novel methods and form factor solutions that may allow for the thinning and flexibility of some components are desired both for improvements in the production of ophthalmic devices and for the general advancement of incorporating electronic components on non-flat applications. It is important to note these improvements may find use in non-ophthalmic applications as well. It is also desirable that methods be generated to address ophthalmic and non-ophthalmic requirements as they relate to electronic components on three-dimensional substrates.

SUMMARY OF THE INVENTION

The thinned and flexible semiconductor elements in accordance with the present invention overcomes the disadvantages associated with the prior art as briefly described above.

The present invention describes methods and devices that relate to the utilization of thinned flexible components. In some exemplary embodiments, the resulting devices may be incorporated into an energized ophthalmic lens with additional functionality. For example, thinned flexible components may be included in an energized ophthalmic lens that comprises a variable optic portion capable of changing the optical properties of the lens in discrete manners. Furthermore, the present invention teaches methods of incorporating thinned and flexible semiconductor devices and elements into space-defining and/or functional structures. In some exemplary embodiments, there may be non-semiconductor elements that might be within the scope of the invention. For example, in some exemplary embodiments it may be desirable to include a thin flexible silicon dioxide piece with vias as an element.

In some exemplary embodiments these structures will have regions within them that are not planar and therefore have three-dimensional shape. In these embodiments, the regions may have deposited metallurgical contacts and electrical routing features upon the complex surface. The thinned and flexible semiconductors components may be applied upon the metallurgical contacts, electrical routing features, and upon the complex surfaces. To attach the flexible devices, the devices may sometimes need to be bent or deformed from their normal resting state in order to conform to the complex surface.

Many different designs for the space-defining structures and regions therein may exist depending on the desired characteristics of the device. The different designs may result in complex three-dimensional surfaces within the regions that may sometimes require flexibility of some or all of the device components. For example, in cylindrical designs modeled to be positioned around an ophthalmic device component, a flexible surface may be contoured around at least a portion of a radial path of the ophthalmic device component. When the flat surface is turned around and upon the radial path to form a cylindrical shape, an axis of the cylindrical design may be defined by the perpendicular direction to the radial path.

Numerous methods and designs that may be used to position thinned and flexible semiconductor elements within or on different three-dimensional surfaces will be apparent to one skilled in the art from the methods and examples described in this disclosure. In some aspects of the present invention, the methods and designs may provide for additional or improved functionality of the device itself, i.e. design features. In some exemplary embodiments relating in particular to ophthalmic lenses, a design example, used to prevent unintended light scattering by the semiconductor elements and conforming to space requirements of the device, includes a cylindrical design positioned around a component, for example, a variable optical component, with its axis pointing in a direction that a light beam may take when it proceeds through at least some parts of the ophthalmic device and into the eye. This may be referred to as the axis of an optical path.

Additional types of device characteristics may dictate the surface region where flexible devices may be attached. In some exemplary embodiments, the surface regions may include designs that are conical or cone-shaped. The cylindrical design features share some similarity to cone features; however, they differ in that in a cone feature the dimension of the top radial path and the bottom radial path of the bent semiconductor may be different. This is understood from a review of the characteristics of a simple truncated cone where one end is smaller in radius than the other. The thinned semiconductor devices may be bent into a cone; however, unlike the cylindrical design type feature, the starting shape to bend a flexible device into a cone is not rectilinear—that is it does not have straight peripheral sides. Rather it has curved or curvilinear sides.

A different type of feature used in an ophthalmic device that may describe the surface region where flexible components may be attached may derive from shapes referred to as flaps. Flaps are regions which can be deployed along the general surface shape of the ophthalmic device. The flaps may be flat or non-flat. In the case of non-flat flaps, the surface topology of the flap may vary in multiple directions; however a typical case would occur with variation in both a radial direction of the ophthalmic device and in a direction perpendicularly outwards from the radial direction. Flexible devices may be deployed upon the surfaces of these flaps and interconnected in numerous ways including by the use of interconnects which are formed upon the larger surfaces of the flap features. In related aspects of the invention, different flap designs can be used in an ophthalmic device to increase the eye's oxygen exposure.

The present disclosure may enable numerous advantages in various types of devices where flexibility may be advantageous and space constrains generally exist. One type of device includes semiconductor devices with integrated circuits built upon and within them. There may be numerous semiconductor devices including those made of silicon in its various forms, including crystalline, polycrystalline and amorphous, along with other semiconductors such as silicon germanium and gallium arsenide. As well, a complicated device structure may be formed from substrates where the semiconductor layer may be significantly thin and fabricated in manners that place it on top of an insulator layer. Thinned versions of such semiconductor-on-insulator layers may result in significantly thin and relatively transparent characteristics where the nature of light interaction, with either semiconductor bulk or semiconductor-on-insulator devices, may have additional significance for device performance. For example in some exemplary embodiments, additional significance for device performance can include the ability to configure devices that have utility for light-interacting signals.

BRIEF DESCRIPTION OF THE DRAWINGS

The foregoing and other features and advantages of the invention will be apparent from the following, more particular description of preferred embodiments of the invention, as illustrated in the accompanying drawings.

FIGS. 11A-11C illustrate exemplary circuit interconnect reliability and design aspects thereof.

DETAILED DESCRIPTION OF THE PREFERRED EMBODIMENTS

Figure 1A:
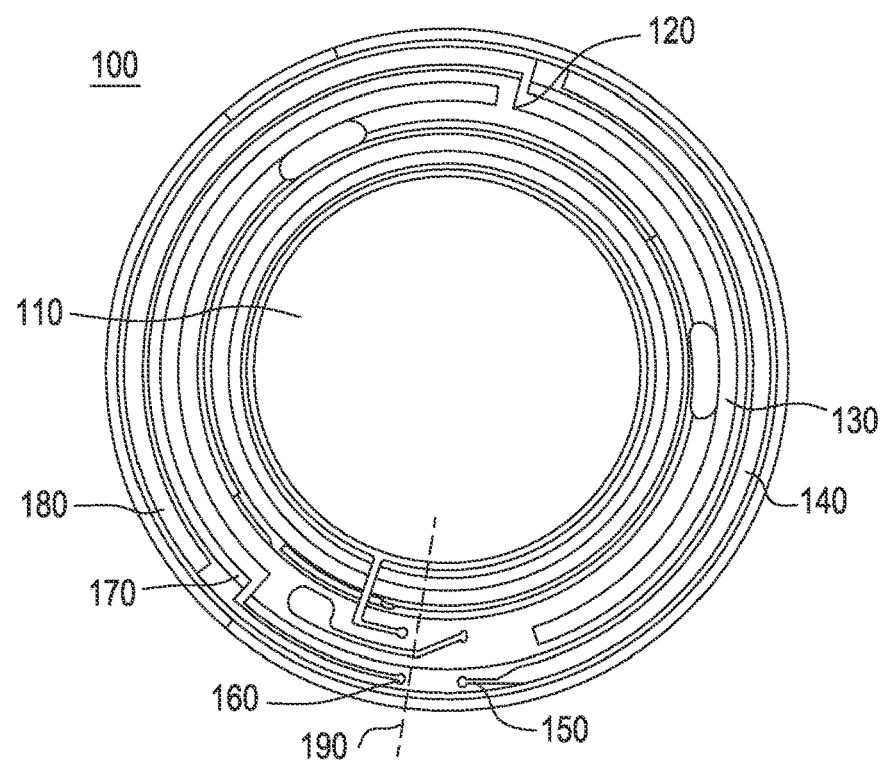
FIGS. 1A and 1B illustrate an exemplary three-dimensional substrate that may be used in some ophthalmic devices.

The present invention relates to methods and devices useful to the utilization of thin and flexible semiconductor devices located upon three-dimensional surfaces. In the following sections detailed exemplary descriptions of embodiments of the invention will be given. The description of both preferred and alternate embodiments are exemplary embodiments only, and it is understood that to those skilled in the art that variations, modifications and alterations may be apparent. It is therefore to be understood that the exemplary embodiments do not limit the scope of the underlying invention.

Glossary

In this description and claims directed to the presented invention, various terms may be used for which the following definitions will apply:

"Cylinder Shape" as used herein and sometimes referred to as "Cylindrical Shape" refers to a generally flat surface flexible component contoured around at least a portion of a radial path such that in a cross section, a circle, circular ellipse or oval can form at least a portion of a rectilinear cylindrical shape. In some cylindrical shapes, an axis of the cylindrical design may be defined by the perpendicular direction to the radial path.

"Energized" as used herein refers to the state of being able to supply electrical current to or to have electrical energy stored within.

"Energy" as used herein refers to the capacity of a physical system to do work. Many uses within the present invention may relate to the capacity being able to perform electrical actions in doing work.

"Energy Source" as used herein refers to device or layer, which is capable of supplying energy or placing a logical or electrical device in an energized state.

"Energy Harvesters" as used herein refers to device capable of extracting energy from the environment and convert it to electrical energy.

"Functionalized" as used herein refers to making a layer or device able to perform a function including for example, energization, activation, or control.

"Flap" as used herein refers to a surface region where flexible components may be attached. In different exemplary embodiments, flaps may be flat or non-flat. In the case of non-flat flaps, the surface topology of the flap may vary in multiple directions; however a typical case would occur where variation would occur both in a radial direction and in a direction perpendicularly outwards from the radial direction. Flexible devices may be deployed upon the surfaces of these flaps and interconnected in numerous manners including by the use of interconnects which are formed upon the larger surfaces of the flap features. For example in various designs of energized ophthalmic device, flaps may be used to provide for improved oxygen exposure to the ocular surface on which the ophthalmic device can rest on.

"Flexible" as used herein refers to the ability of an item to be spatially deformed or bent from a state with a first three-dimensional shape to a state with a second and different three-dimensional shape, wherein the deformed item does not macroscopically break during deformation.

"Lens" as used herein and sometimes referred to as "Ophthalmic Device" refer to any ophthalmic device that resides in or on the eye. These devices may provide optical correction or may be cosmetic. For example, the term lens may refer to a contact lens, intraocular lens, overlay lens, ocular insert, optical insert or other similar device through which vision is corrected or modified, or through which eye physiology is cosmetically enhanced (e.g. iris color) without impeding vision. In some exemplary embodiments, the preferred lenses of the invention are energized generally soft contact lenses made from silicone elastomers or hydrogels, which include but are not limited to silicone hydrogels, and fluorohydrogels.

"Lens Forming Mixture" or "Reactive Mixture" or "RMM" (reactive monomer mixture) as used herein refer to a monomer or prepolymer material that may be cured and crosslinked or crosslinked to form an ophthalmic lens. Various embodiments may include lens-forming mixtures with one or more additives such as UV blockers, tints, photoinitiators or catalysts, and other additives one might desire in an ophthalmic lenses such as, contact or intraocular lenses.

"Lens Forming Surface" refers to a surface that is used to mold a lens. In some exemplary embodiments, any such surface may have an optical quality surface finish, which indicates that it is sufficiently smooth and formed so that a lens surface fashioned by the polymerization of a lens forming material in contact with the molding surface is optically acceptable. Further, in some exemplary embodiments, the lens-forming surface may have a geometry that is necessary to impart to the lens surface the desired optical characteristics, including, spherical, aspherical and cylinder power, wave front aberration correction, corneal topography correction and the like as well as any combinations thereof.

"Lithium Ion Cell" as used herein refers to an electrochemical cell where Lithium ions move through the cell to generate electrical energy. This electrochemical cell, typically called a battery, may be reenergized or recharged in its typical forms.

"Substrate Insert" as used herein refers to a formable or rigid substrate capable of supporting an energy source within an ophthalmic lens. In some exemplary embodiments, the substrate insert also supports one or more components.

"Mold" as used herein refers to a rigid or semi-rigid object that may be used to form lenses from uncured formulations. Some preferred molds include two mold parts forming a front curve mold part and a back curve mold part.

"Optical Zone" as used herein refers to an area of an ophthalmic lens through which a wearer of the ophthalmic lens sees.

"Power" as used herein refers to work done or energy transferred per unit of time.

"Rechargeable" and also referred to as Re-energizable" as used herein refer to a capability of being restored to a state with higher capacity to do work. Many uses within the present invention may relate to the capability of being restored with the ability to flow electrical current at a certain rate for certain, reestablished time period.

"Reenergize" and also referred to as "Recharge" as used herein refer to restoring energy to a state with higher capacity to do work. Many uses within the present invention may relate to restoring a device to the capability to flow electrical current at a certain rate for a certain, reestablished time period.

"Released From a Mold" as used herein means that a lens is either completely separated from the mold, or is only loosely attached so that it may be removed with mild agitation or pushed off with a swab.

"Stacked" as used herein means to place at least two component layers in proximity to each other such that at least a portion of one surface of one of the layers contacts a first surface of a second layer. In some exemplary embodiments, a film, whether for adhesion or other functions may reside between the two layers that are in contact with each other through said film.

"Stacked Integrated Component Devices" as used herein and sometimes referred to as "SIC-Devices", refers to the product of packaging technologies that may assemble thin layers of substrates, which may contain electrical and electromechanical devices, into operative integrated devices by means of stacking at least a portion of each layer upon each other. The layers may comprise component devices of various types, materials, shapes, and sizes. Furthermore, the layers may be made of various device production technologies to fit and assume various contours, as it may be desired.

"Three-Dimensional Surfaces" as used herein, refers to a property of a surface at a macroscopic level to be non planar in portions of its extent. The surface of a sphere or a human eye, for example, would be a three-dimensional surface since the points on such a surface to do not generally reside in a single plane. The surface of a typical electronic circuitboard may be a surface that is not a three-dimensional surface since such boards are typically planar in nature; even if at a microscopic level they are not perfectly planar.

Three-Dimensional Devices with Incorporated Semiconductor Devices

Numerous novel devices may arise from the integration of thin and flexible pieces of semiconductors into components and devices that require certain three-dimensional shapes. In an example of one such device type, ophthalmic devices that may incorporate electroactive components are considered.

Figure 1B:
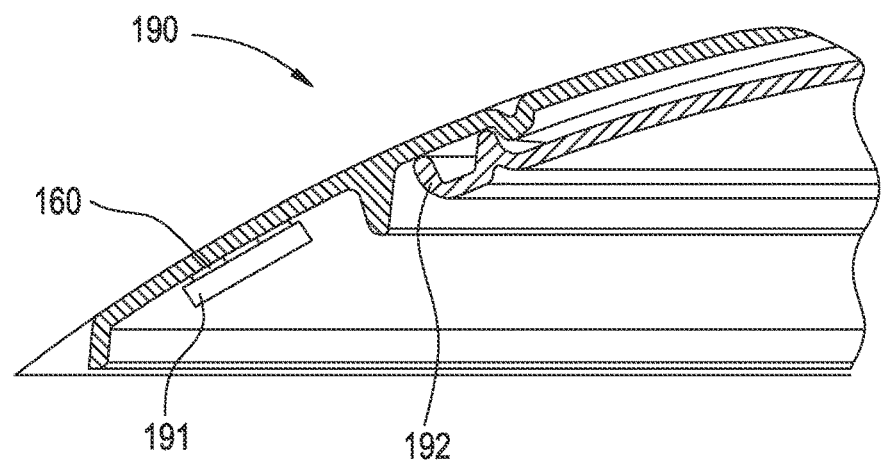

Referring to FIGS. 1A and 1B, an exemplary three-dimensional substrate 100 for an exemplary ophthalmic device is depicted. Different ophthalmic device embodiments may be formed upon the exemplary three-dimensional substrate and may be functionalized to include an active focusing element. The active focusing device may function while utilizing energy that may be stored in one or more energization elements. Traces upon the three-dimensional substrate may be used to provide a good base to form energization elements upon and upon which to affix, attach or support semiconductors. Semiconductor devices may be sufficiently thinned to have some ability to be bent, or otherwise deformed, to fit in more conformal manners upon three-dimensional surfaces. Additionally, general aspects of exemplary three-dimensional systems, methods, apparatus, and resulting exemplary devices related to these concepts will be described.

In the exemplary ophthalmic device of FIG. 1, the three-dimensional substrate may include a region 110 that is optically active. If the device is a focusing element, the region 110 may represent a front surface of an insert device that comprises the focusing element through which light passes on its way into a user's eye. Outside of this region, there may typically be a peripheral region of the ophthalmic device that is not in an optically relevant path. Accordingly, it may be appropriate to place components related to the active focusing function in such a peripheral region. In some exemplary embodiments, these components may be formed from thin and flexible semiconductors. Additionally, the components may be electrically connected to each other by metal or other conductive traces. The traces may also be used to provide support for the incorporation of energizing elements into the ophthalmic device.

In some exemplary embodiments, the energization element may be a battery. For example, the battery may be a solid-state battery or alternately it may be a wet cell battery. In either of these examples, there may be a minimum of at least two traces, which are electrically conductive to provide for an electrical current flow between the anode of the battery and a cathode of the battery. The battery may provide an electrical potential and current to other active elements in the device for their energization. In the exemplary device of FIG. 1, one battery connection may be defined in the region of an electrical trace 150. For the purpose of example, electrical trace 150 may be the anode connection and represent the (−) potential connection of an energization element to incorporated semiconductor devices. Another battery or energization element connection 160 may be included. Again, for the purpose of example, such a connection may represent the cathode connection. This connection 160 may also represent the (+) potential connection of an energization element to incorporated devices.

At 100, it may be observed that electrical traces may be connected to items 150 and 160 and items 140 and 170 respectively. It may be observed that both traces 140 and 170 may be isolated traces that may lay in proximity to a neighboring trace. The neighboring trace for 140 may be 130, and the neighboring trace for 170 may be 180. The neighboring traces 130 and 180 may represent the opposite battery chemistry or electrode type when battery elements are produced upon these traces. Thus, trace 130 may be connected to a chemical layer that can make it function as a cathode of a battery cell between traces.

Traces 130 and 180 may connect to each other through region 120. Region 120 may in some exemplary embodiments be not covered or partially covered by chemical layers. It may therefore, function as an electrical interconnection. It will be apparent that in this example, there may be two pairs of electrical cells configured as batteries and that the nature of the layout and design connects these two batteries in a series connection. The total electrical performance across connections 150 and 160 may therefore be considered a combination of two battery cells.

At 190, a cross section may be depicted of the region along the dotted line. In the lower representation of 100, a number of features relevant to the discussion of thin semiconductors are depicted. In the present exemplary embodiment, at 160, one of the two energization connections described above is depicted and the energization connections that occur at 150 may be out of site behind energization connection 160. A chip form of a semiconductor is represented as 191 on the figure. For illustrative purposes, the semiconductor may be connected using solder ball or conductive epoxy connections to conductive elements on a semiconductor package. Within the semiconductor package may be located the semiconductor chip, or the semiconductor chip may be a bare die. Flip-chip die attach may be used. A device of this type may function well for the purposes of the exemplary ophthalmic devices; however, in other applications there may be extra thickness and area dimensions that such a packaged thick semiconductor chip may require. Direct connection of a thinned semiconductor to the three dimensional substrate may allow for the use of less device thickness, the incorporation of more semiconductor device and other improvements relating to both the thin form factor and the flexible nature of thinned unpackaged semiconductors. Although, thinned pieces of semiconductor may be formed into the similar shape as they type of chip 191, many other types of shapes and dimensions may be practical when the flexible nature of thin semiconductors is considered.

As a matter of reference, at 192, there may be an area of the ophthalmic device where a front optic piece as depicted in the top section of 100 may be joined to a back optic piece. At 192, a portion of a back optic piece is depicted with region 192 being the combination of the front optic and back optic with topology that may provide for one or a set of features to seal components between the two optic pieces. The set of features in this region where the sealing will be made is referred to as a glue groove. As further discussed in upcoming parts the glue groove region may also be relevant in other exemplary embodiments where thinned semiconductor devices may be incorporated into other three-dimensional structures.

Thinning of Semiconductor Elements

Figure 2A:
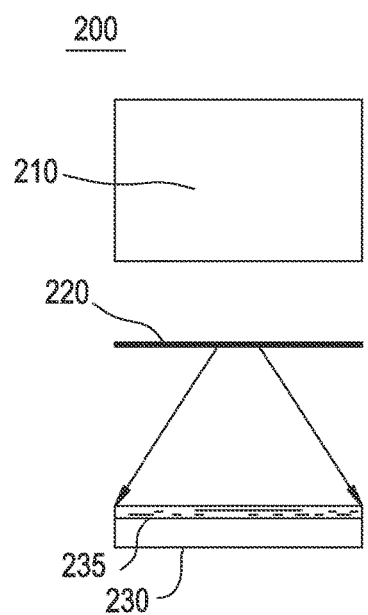
FIGS. 2A and 2B illustrate exemplary aspects of thinning for semiconductor and semiconductor on insulator substrates.

Referring now to FIG. 2, at 200, the general nature of processes to thin semiconductor devices that may be used for some exemplary embodiments of the present invention is depicted. At 210, a representation of a portion of a substrate of full thickness that has been processed through a semiconductor manufacturing line is depicted. Typically, such substrates, not shown to scale, may be 500-900 microns thick depending on a number of factors known in the art. Substrate 210 may be a monolithic or "bulk" semiconductor type substrate. As an example, a majority of the thickness of substrate 210 may be composed of highly pure, doped, crystalline silicon where only a thin surface of the substrate has devices and interconnects upon it.

For a variety of reasons, it is generally a standard in the industry for processed wafers to be thinned before the devices on the substrate are used. At 220, subsequent to thinning, the substrate may assume a thickness that may be a fraction of the starting thickness. This may result in very thin substrates. Accordingly, the thinned material may be found in the "magnified" cross section representation made up of layers 235 and 230. Methods to achieve very thin product results where the ending thickness of the product may be as thin as 30 microns thick or even smaller are currently available and known as the state of the art. In an example of such a thinned product, the two layers may represent a very thin bulk semiconductor layer 230 and a layer comprised of the metallization or interconnects 235 for the semiconductor device.

Figure 2B:
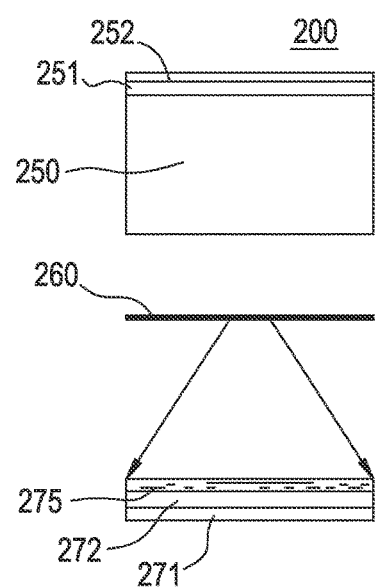

Referring to FIG. 2B, a similar thinning process description is made but for a case where a silicon-on-insulator type of substrate used. In the substrate, formed by layers 250, 251 and 252 a semiconductor-on-insulator substrate is represented. As known in the art, there are many types of semiconductor-on-insulator substrates that may be possible. One example may include, a bulk layer 250 of very pure crystalline silicon upon which sits a region of insulator, such as, silicon dioxide 251. Upon the insulator region, 251 may sit another semiconductor layer 252, which, for example, may comprise a couple hundred-angstrom thick layer of silicon. The combination of layers provides an example of a semiconductor (silicon) on insulator (silicon dioxide) substrate.

Since the semiconductor (silicon) top layer may be very thin, numerous methods may be used to thin the entire substrate as a whole. In an example, the back silicon layer 250 may be ground away in a grinding operation to where its residual thickness is nominally zero thickness. In practice, such a grinding operation may have non-uniformities inherent and there may be regions of residual silicon on the backside. As a result, additional processing, for example, through reactive-ion etching, may be used to selectively remove the silicon and not remove the silicon dioxide. After the processing, the remaining substrate 260 may be a very thin combination of the device layer 272 and of an insulator layer 271, which is what is left of layer 251. Upon the thin oxide layer may be the thin semiconductor layer 272 (formerly 252 before the depiction of thinning). Upon this layer may be the metallization or interconnect layers 275 of the semiconductor device.

When a device is thinned as represented in the device with layers 230, and 235 or with the layers 271, 272, and 275 there may be a number of properties that result. In a first major discussion point herein, the thin substrate may assume a degree of flexibility that is not typical of full thickness substrates. Within certain limitations, the thin substrate may be deformed to conform to other three-dimensional substrates upon which they may be affixed. In the process of deformation, there may be some added defectivity of the device, which amongst other aspects, may be a function of the degree of bending and the nature of the circuit design. In some exemplary embodiments, different design features may be incorporated to compensate where the degree of deformation necessary for the application results in any small but tolerable increases in defectivity.

Another important aspect of thin substrates is that the degree to which light, even in the visible spectrum may interact with the thinned substrates. Even in cases where the substrate semiconductor thickness after thinning may still be enough to absorb the incident light radiation, as may be the case with layer 230, such a layer may have a significant level of photocurrent from such absorption that may require design changes or other actions to mask the thin layers from interaction with light. In a non-limiting example, it may be possible to shield at least portions of the design through the use of some of the interconnection features that are made upon the three dimensional substrates as it may be the case, for example, with feature 170 in FIG. 1.

Referring back to FIG. 2B, layer 272, which is a thin semiconductor layer that sits upon an insulator layer 271, may be transparent to incident light. Further, it may be possible for a significant fraction of the incident light to proceed through both the insulator layer 271 and the semiconductor layer 272. If specialized metallurgy, as for example formed from Indium Tin Oxide or other "transparent metals," were used it may be possible to create thin electronic layers which may be flexible and use semiconductor-on-insulator substrates where the semiconductor layer is very thin and transparent. Additionally, using this type of thin and transparent device, it may be possible to attach electronic layers in portions of the ophthalmic device where light may pass through the ophthalmic device and into the eye.

When the semiconductor devices become thin, they may become flexible. This flexibility is a factor discussed in some of the inventive art herein. Nevertheless, there may be some limitations to flexing the devices or alternately there may be some additional defect modes that occur in devices when they are flexed. Therefore, although some of the depictions of flexing of the device semiconductor have and will in later sections be referred to where there is a significant degree of bending, the back support for the bent pieces may be important in the stabilization of the device into a relatively rigid piece after it has been flexed onto a three-dimensional structure.

In any of the various exemplary embodiments relating to the flexing of the thinned semiconductor element so that it matches a three-dimensional surface feature, the flexed device may need to be adhered to lock the bent configuration into place. In some exemplary embodiments, the device may be attached using interconnection technology. For example, solder balls may be used to adhere contacts on the flexible semiconductor element to matching contact features which can be located on the three-dimensional surface. In some cases, these contact points may provide an electrical function, in other cases, they may be present for providing means for attachment of the flexible element, and in still other cases, they may provide both functions. Subsequent to bonding the contact features, the resulting structure may have an adhesive material undercoating. In undercoating, an adhesive may be caused to flow into the vacant space between the flexible element and the three-dimensional substrate. In some exemplary embodiments, where the interconnection between the flexible element and electrical interconnects in the device is not performed between the flexible device surface and its corresponding surface feature on the three dimensional substrate, adhering the flexible substrate to the three-dimensional surface with an adhesive may be a means of affixing the element. Numerous bonding and adhesive techniques can be used to affix and stabilize a flexible thinned semiconductor piece.

Ophthalmic Three Dimensional Device Relevance to Flexible Elements

Figure 3A:
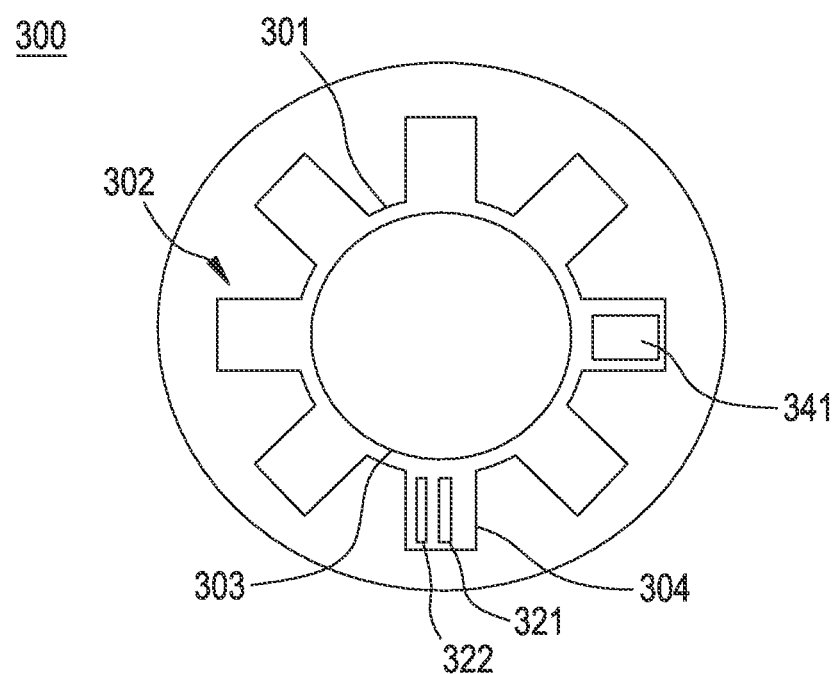
FIGS. 3A and 3B illustrate an exemplary flap structure incorporated into an ophthalmic device.
Figure 3B:
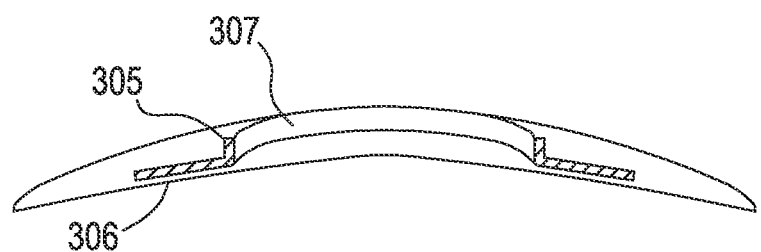

Referring now to FIGS. 3A and 3B, at 300, a second three dimensional device for use in ophthalmic devices is depicted. At 302, the material, which may preferably comprise a hydrogel polymer that the ophthalmic device may be formed from, is depicted. An insert including an electroactive optic region 303 may be included within the polymerized hydrogel material 302. An interconnection device 301 may be wrapped around the edge of the electroactive optic insert. In some examples, the interconnection device may fully wrap around the insert, or in other examples the interconnection device may wrap around a portion of the insert. The interconnection device may be a three-dimensional formed polymeric piece upon which interconnects may have been deposited or otherwise formed. When the piece 301 is formed, it may be formed with features that may be described as flaps 304. The flaps 304 may also be observed in cross-section at 306 in FIG. 3B, where a formed cylindrical design 305 surrounds the insert with the electroactive device 307.

The flaps and the deposited interconnects may form good surfaces upon which to attach and connect flexible thin semiconductor devices. As depicted, a flexible semiconductor device 341 may be a relatively large device that may be attached upon one of the flap features. Alternately, in some exemplary embodiments numerous thin strips of semiconductor device may be connected on a flap type feature as shown at 321 and 322. In each of these cases, due to the flexibility of both the flaps and the electronic devices, the electronic devices may be bent into a three-dimensional shape. It may be helpful to consider such bending to be occurring across two dimensions, for example both radially in the direction radiating out from the center of the ophthalmic device and also in a perpendicular direction to the radial direction. Since the flap features have significant space between themselves, another characteristic of such a support and assembly design may be that the ophthalmic lens may include a significant portion of its body made from oxygen permeable hydrogel material which may provide for oxygen penetration benefits for the eye.

Figure 4A:
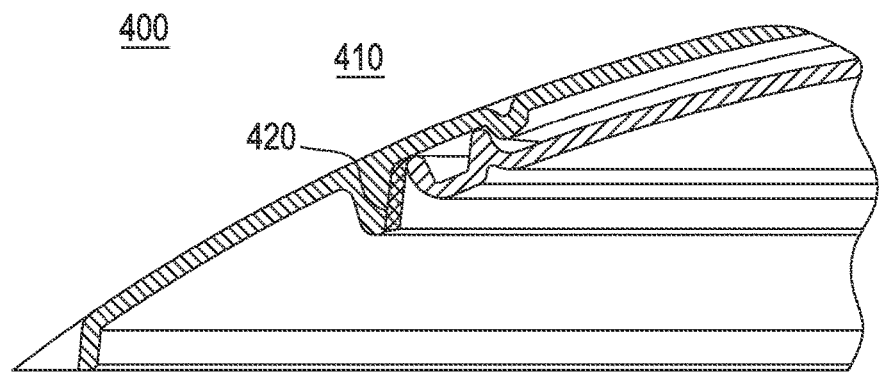
FIGS. 4A and 4B illustrate exemplary vertical design features located upon structures of an ophthalmic device.
Figure 4B:
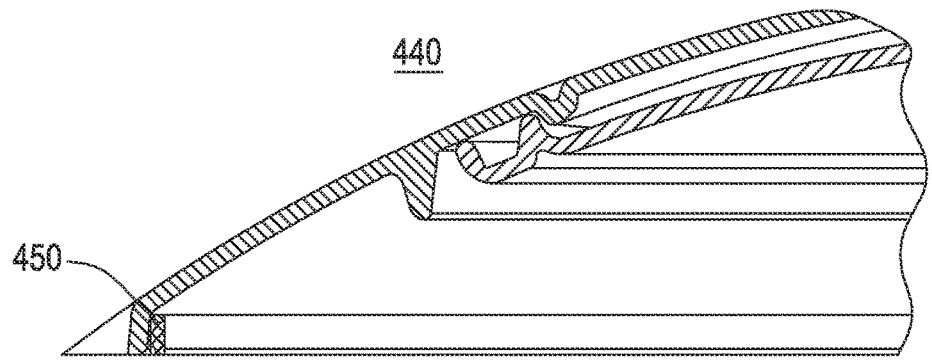

Referring to FIGS. 4A and 4B, at 400, a different exemplary type of mounting scheme for thin and flexible devices is depicted. In these exemplary depictions, the thin and flexible device may be attached along portions of an ophthalmic lens insert in a radial fashion. That is the flexible semiconductor may be wrapped around circular features forming, for example, a tube-like feature when the flexible semiconductor is long enough to reach from beginning to end. At 410, a cross-sectional representation depicts a portion of the flexible thin semiconductor wrapped around and adhered to a three-dimensional surface feature of the glue groove (see for reference item 192) of a front optic piece (see for reference item 100). In another similar exemplary embodiment, at 440, the flexible semiconductor may be wrapped around a more exterior edge 450 thereby allowing access to more area by virtue of the increased diameter and hence circumference.

When semiconductor pieces are wrapped in such a tube-like manner, the bending of the semiconductor may be characterized as happening along one dimension. The depictions of FIGS. 4A and 4B may be described as being oriented in cylindrical-like features where the semiconductor sits in a vertical orientation. At any local region of a point along the surface of a flexible semiconductor in this vertical orientation, the surface will "appear" flat in a vertical direction but in the orthogonal direction, the surface is bending. The degree of the bending is a function of the radius of curvature of the surface that the semiconductor may be mounted to, and therefore, at 420 the semiconductor may be more "bent" or flexed or stressed than at 450. At a microscopic level, there may be asymmetric stresses that occur in the semiconductor bulk and other corresponding elements of the device, like for example, the metal interconnects.

Figure 5A:
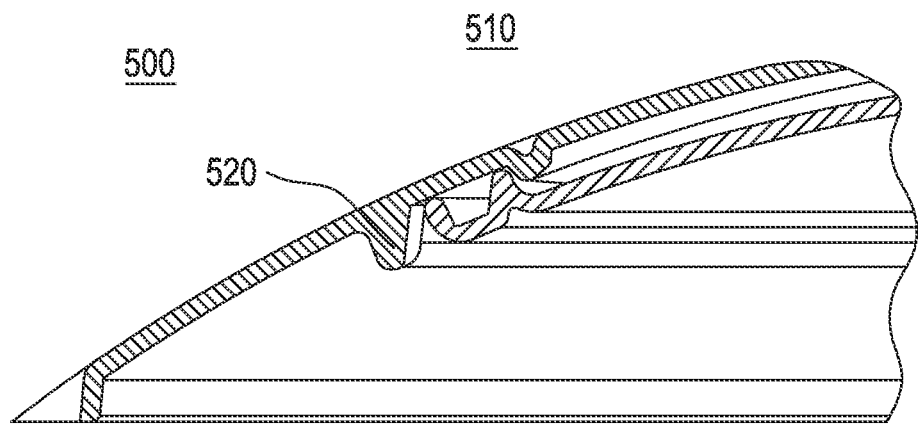
FIGS. 5A and 5B illustrate exemplary conical design features located upon structures of an ophthalmic device.
Figure 5B:
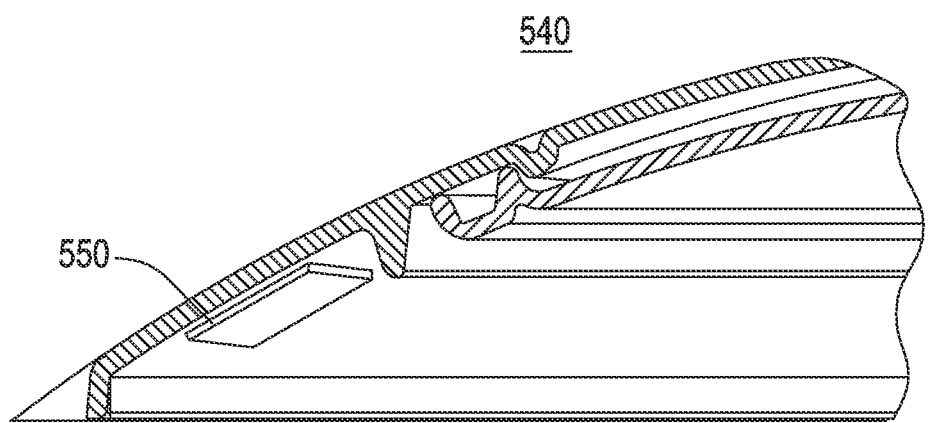

Referring now to FIGS. 5A and 5B, at 500, another type of flexibly mounted semiconductor is depicted. In both the orientation depicted at 520 in cross-section 510 and in the orientation depicted at 550 in cross-section 540 the flexible semiconductor can be arranged into conical arrangements. However, starting pieces of silicon to form a cone may be curvilinear rather than rectilinear. The degree of bending of the semiconductor layer may be similar to that of the radially bent semiconductor devices that were mentioned above. However, since the pieces are curve-shaped before they are applied, the nature of the bending at a microscopic level will be different and in some exemplary embodiments may provide a defect level advantage.

Other physical attribute advantages of a conical placement of flexible thinned electronics may occur. In some exemplary embodiments of a three-dimensional object that receives thinned semiconductor devices, the overall thickness of the three-dimensional object, including both the support and the attached devices, may be important. In flap-type embodiments, the added height of the attached electronics to the substrate flap may be minimal, in some implementations this minimal thickness addition may be close to the thickness of the electronic device. In flap implementations the limitations on the size parameters of the semiconductor device piece may not be severe. On the other hand, for a cylindrical-shape flexible semiconductor, in fact it may be possible to have an embodiment where there is no net add of thickness to the ophthalmic device since the effects of device thickness and interconnect may be radially distributed. However, in some exemplary embodiments that include a radial piece implementation, the maximal width (arbitrarily chosen as the dimension in the mentioned vertical dimension) of the thinned semiconductor device may be significantly constrained; being less than 50 microns. A conical shaped embodiment may have characteristics of these types that are in between the two mentioned embodiments. There may be some added height to the ophthalmic device since, based on the angle of the conic section, some of the thickness will not be distributed radially. Alternately, by the same effect of the angle of the conic section, the width of the semiconductor device may also be wider than a purely radial or cylindrical shape type implementation.

Figure 6:
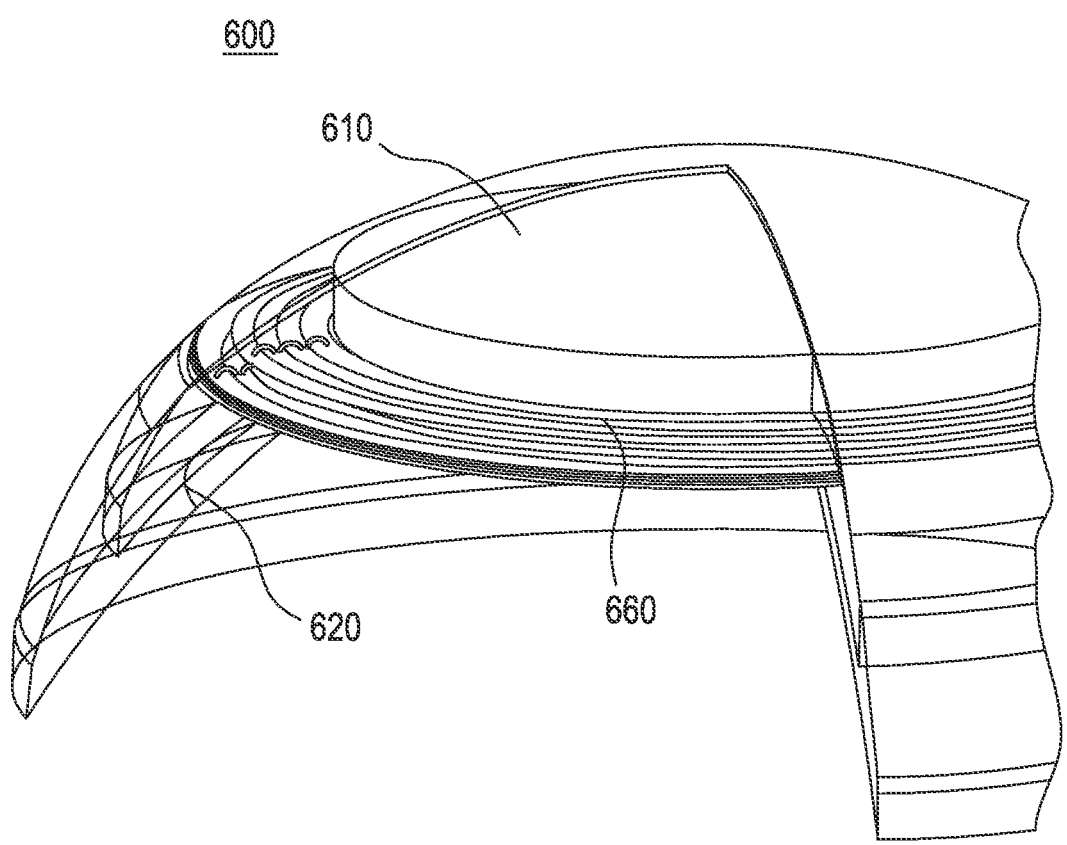
FIG. 6 illustrates an exemplary radial trench design feature located upon structures of an ophthalmic device.

Referring now to FIG. 6, at 600, an orientation, which has been an example for stacked integrated devices in prior disclosures of the same inventive entity, may be relevant to review in the context of three-dimensional, attached semiconductor devices. It will be clear to one skilled in the art from this disclosure that all of the exemplary embodiments that have been discussed thus far have relevance to stacked device implementations, but for ease of description embodiments with a single layer have be used to describe the nature of the invention. Nevertheless, there should be no limitation of the art related to these descriptions and implementations of stacked devices are consistent with the art.

Referring back to FIG. 6, at 610 there may be an insert portion that may represent an active ophthalmic device that may be controlled by thin and flexible semiconductor devices and energized by energization elements within the ophthalmic device. The type of implementation illustrated at 600 may also be referred to as a trench type of implementation in this disclosure. In some of these embodiments, the active element and the thin semiconductor devices are enclosed in a media insert 620. At 660, thinned and flexible semiconductor device are represented. In these embodiment types, the semiconductor may assume a roughly flat or planar orientation as it may be attached to nearly planar surfaces in the ophthalmic device. The thinner the device is, the less height that may be added to the overall ophthalmic device. However, for minimal impact on the ophthalmic device, the width, in this case of the annular semiconductor region, may be limited. In some exemplary embodiments, it may be possible for pieces to achieve widths of 0.25 mm and still not significantly add to the dimensions of the overall ophthalmic device. It is important to note that in alternate embodiments, a stacked die approach may include conical structures with increasing and/or decreasing diameters. Like the cone type implementations; however, the raw pieces of silicon that must be diced or cut before installing into the ophthalmic device are curvilinear not rectilinear, which is more common in semiconductor device implementations. Unlike the previously discussed implementations since bending of the semiconductor may not occur in these types of embodiments, there may be less stress-induced effects in the substrate.

In the following table some reference estimations and representations for some typical aspects of the various types of implementations are given. These numbers are representative and should not provide limitations for the scope of the inventive art. However, they may demonstrate differences between the embodiment types and relative advantages in light of certain parameters.

TABLE 1

Comparisons of different implementation types for thin flexible elements on three-dimensional surfaces

| Type | Stress "X" | Stress "Y" | Height | Shape | Length mm | Width mm | Area mm$^2$ | Oxygen |
|---|---|---|---|---|---|---|---|---|
| Cylindrical 7 mm radius | 0.15 | 0 | Variable | Rectilinear | ~110 | ~0.1 | ~11 | Better |
| Cylindrical 9 mm radius | 0.12 | 0 | Variable | Rectilinear | ~250 | ~0.1 | ~25 | Nominal |
| Flap | ~0.15 | ~0.15 | Near Zero | Normal | ~4 | ~4 | ~16 | Best |
| Conical 6 mm radius | 0 < X < 0.15 | 0 | Variable | Curvilinear | ~110 | ~1 | ~25 | Better |
| Trench 6 mm radius | 0 | 0 | Near Zero | Curvilinear | ~110 | ~1 | ~110 | Better |

In the table a "Stress" parameter is given. This may be a figure-of-merit for comparison purposes. Generally the parameter is meant to indicate how much bending a substrate may have when deployed in the given type of implementation, where the measure of stress is, for a given movement of one mm in a direction, how much has the substrate been bent from its normal and flat condition. It may be best to consider a first direction as "X" where the maximal bending occurs. A second stress parameter "Y" can be based on the same measurement as mentioned for "X" but in an orthogonal direction when referenced to the "unbent" substrate.

The "Height" measurement is meant to imply how much additional height may be added to the ophthalmic device by the orientation. The measure is a relative measure as the actual impact on height is complicated by other factors including how much height other components in the ophthalmic lens demand. If the width of the semiconductor piece, for example, in a cylindrical shape type orientation is less than the needed height of an active ophthalmic component within the lens insert, then the semiconductor piece may not add height to the ophthalmic device regardless of its width.

The "Shape" parameter indicates the nature of pieces of thinned flexible semiconductor as they are diced or cut out as product. Rectilinear type cuts may be more typical of semiconductor devices as opposed to curvilinear cuts where a bent but straight line may represent the nature of dicing or cutting of the substrate to form the device. The "Length" and "Width" parameters are estimates for ophthalmic device type implementations of how long and how wide a piece of thinned silicon may be to be consistent with a given type of implementation. The area estimate is a simple calculation of the area of a piece with the length and width estimates. In the rightmost column, a relative estimate is given of the degree to which a particular design may interact with the ability of oxygen to diffuse underneath the ophthalmic device, when it is worn, to the central region of the optically active portion of the ophthalmic device.

Special Cases of Relatively Transparent, Thinned and Flexible Semiconductors

As mentioned herein, some methods may be used to produce a relatively transparent device including the use of silicon-on-insulator substrates and transparent conductive or "metal" films for the metallurgy of the device. When such a device is employed using the techniques included herein, it may be possible to place some or all of the flexible device in a region of the ophthalmic device in the optic path or a portion thereof. In some exemplary embodiments, the flexible device of this type may be located, in a non-limiting example, on a trench type placement where the trench now is located within the optic zone at depicted in FIG. 7, 700.

Figure 7:
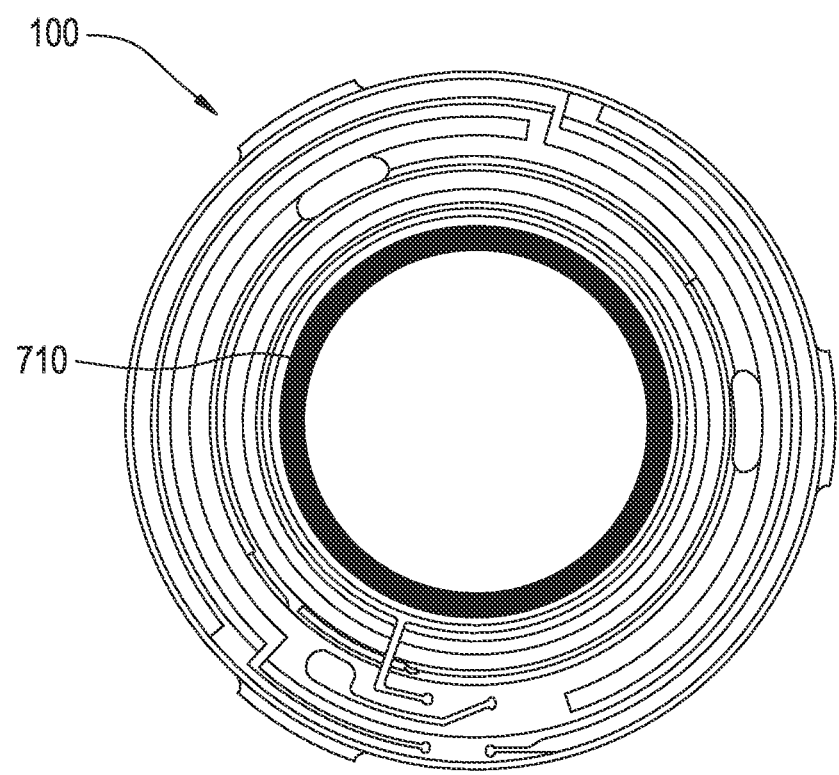
FIG. 7 illustrates the optic region of an ophthalmic device with an exemplary implementation of transparent semiconductor elements.
Figure 8A:
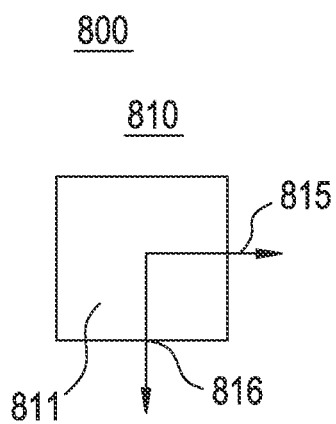
FIGS. 8A-8D illustrate an exemplary representation of flap, vertical, radial, trench, and conical designs static bending aspects.
Figure 8B:
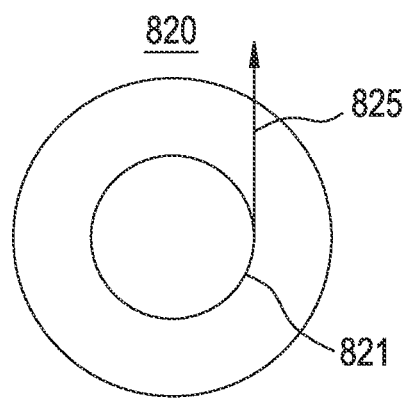
Figure 8C:
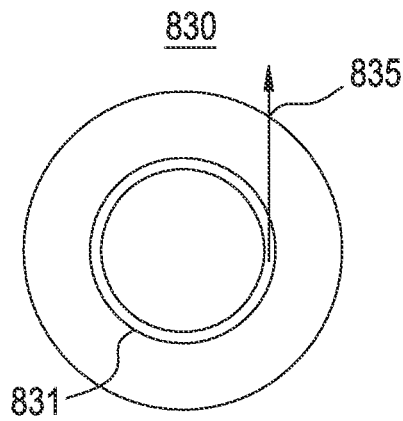
Figure 8D:
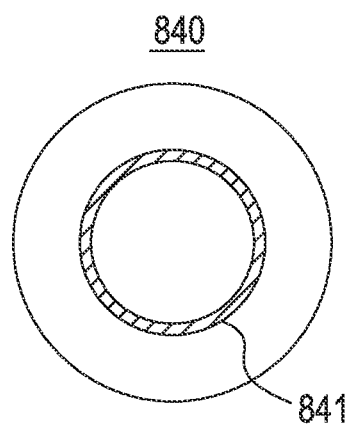
Figure 9A:
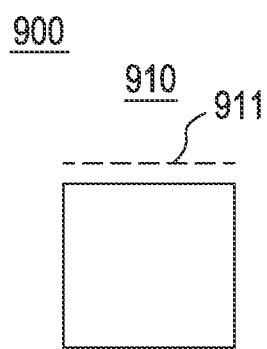
FIGS. 9A-9D illustrate exemplary interconnection aspects for different design types.
Figure 9B:
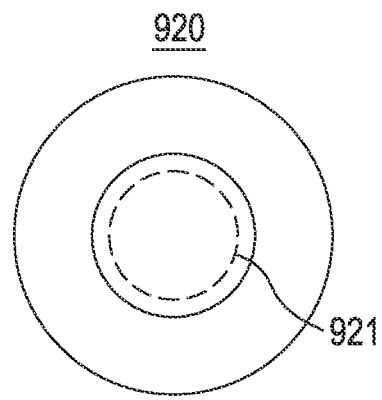
Figure 9C:
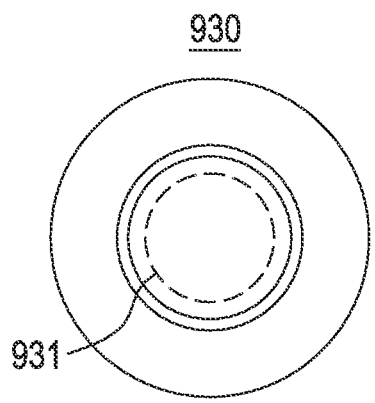
Figure 9D:
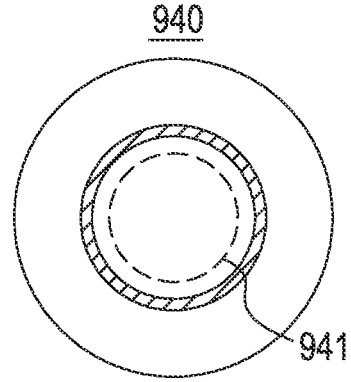

In FIG. 7, at 100 a three dimensional surface representation, which may be the front optic of an electroactive optical component for the ophthalmic device is depicted. Now, in addition to the elements discussed herein, a cylindrical like feature may be located in the more optically active region 710. There may be numerous means to locate a flexible substrate, as presented, including configuring the piece as a cone-type shape or alternately molding the three-dimensional shape 700, to have a flat region for support 710. As mentioned, with special techniques to render the flexible device transparent, it may not interfere with light in the optic path. Such a thinned and relatively transparent device may not significantly interfere with vision.

Stress after Bending and Attaching Flexible Semiconductor Devices

Referring back to Table 1, the different implementation types were tabulated for the "estimated stress" parameters. These parameters were derived using possible bending changes from normal flat silicon for a 1 mm distance along the flexible device. FIG. 8 provides for a different way of depicting the concepts.

Referring now to FIGS. 8A-8D, at 800, exemplary representation of flap, vertical, radial, trench, and conical designs static bending aspects are depicted. At 810, a flap type implementation is depicted. In this type of implementation the flexible substrate may be subjected to stress from bending in two different orthogonal directions. A representation of a flap may be made from region 811 where the bending stress, 815 and 816, may be found in two orthogonal directions. Due to the nature of a flap, in some embodiments, for it to take up the least space it may assume a shape consistent with the ophthalmic device body. Such a shape would sometimes bend both radially and also perpendicular to that.

At 820, a representation for bending stress that occurs with radial bending is depicted. When a flexible piece is bent around a radial direction 821, it has a bending stress in a direction tangential to the radial path 825. However, in the direction perpendicular to that direction, which may be represented as the direction out of the page, the flexible semiconductor may not be bent.

At 830, a cone shaped bending 831 is depicted from a top view perspective and similarly there may be bending stress in directions tangential to the radius of the cone 835 and along the perpendicular the cone can be flat and not bent. However, there may be some subtle differences. For example, the cone actually has two different extremes for the radius of bending. The amount of bending that may occur tangentially to the cone therefore to a certain degree may vary across the flexible semiconductor piece. Thus, the stress condition may be somewhat more complicated for this type of orientation.

At 840, trench type orientations are depicted. In these orientations, the substrate will typically have a cut out that allows for flat mounting of the semiconductor piece 841. In this type of flat orientation, the substrate may not be subjected to bending stress like the other orientations. As has been mentioned in the table, this type of orientation however may require the semiconductor pieces to be formed in circular or semicircular pieces. In some cases, the process of forming the semiconductor pieces without straight edges may subject the peripheral regions of the device to certain inherent levels of stress but this can be distinct from the stress induced by the bending modes of other orientation types.

Interconnection Aspect—Benefits

The different orientation types may provide for different methods for electrical interconnections to be formed with other components within a three dimensional device. As mentioned previously, an ophthalmic device provides a good example for the nature of innovations arising from thinned and flexible semiconductors on three-dimensional surfaces. A thinned and flexible semiconductor device may need to form interconnections including, for example, one or more of: other semiconductor devices within the ophthalmic device, with energization elements, and with active optical components.

Referring to FIGS. 9A-9D, exemplary interconnection aspects 900 for different design types are depicted. At 910, is a representation of an interconnection strategy related to devices on flap type substrates. At 911, a region of a flexible device which may be connected relatively easy to adjoining structures is depicted. It will be apparent to one skilled in the art from the nature of the discussions related to FIGS. 1A and 1B, that it may be possible to deposit electrical interconnects upon the surfaces of three-dimensional substrates. In this, it may be somewhat more complex since electrical interconnects may be made to flexible semiconductors along its periphery or its area.

The exemplary devices depicted at 920, 930 and 940 have a similar location for interconnects to be formed. These locations are shown at 921, 931, and 941 respectively. For cylindrical shape type implementation similar to item 920, a piece of flexible semiconductor may be connected to an underlying substrate connecting to features along the radius. In this case, interconnections may be made anywhere along the periphery and/or over both the top and bottom portions of the thin flexible semiconductor as desired. Therefore, some additional embodiments may be derived by the stacking of thin semiconductor layers upon each other.

In the cylindrical shape type of orientation, the thickness of interconnects that may occur upon one or both the front or the back of the thin semiconductor device generally do not contribute significantly to the overall thickness of the ophthalmic device, which may be an advantage in some embodiments. For example, interconnects in region 921 may include a number of different types including solder ball contacts, conductive epoxies, wire bond strategies and other means of interconnection. As previously mentioned, in some exemplary embodiments the interconnects may be directly deposited upon a three-dimensional surface. In addition, in some cases, a thin flexible interconnect substrate may be attached to the three-dimensional surface before the thin flexible semiconductor device is attached. In this type of example, the flexible semiconductor device may then be attached to the interconnect substrate. This may be different from the cases where attachment of the flexible semiconductor device may be made to interconnects deposited upon the three-dimensional substrate surface.

In the example depicted at 930, a conical implementation is depicted. The situation may be similar to cylindrical shape type implementations. In general, the devices of thin semiconductor layers may have more area in them for a given radius with a conical implementation. However, in some exemplary embodiments, this configuration may cause the ophthalmic device to thicken some. Or, alternately, the area available to semiconductor devices may be limited by the thickness of the ophthalmic device design. The manners of interconnecting the device to other components may also be similar to the radial implementation types; however, due to the angled surface that would result, accounting for interconnections between the flat surface and other features may be necessary.

In the example depicted at 940, a flat trench type implementation is depicted. The interconnects in flat trench type implementations may generally be more standard when compared to semiconductor industry packaging norms due to the flat topology of the thin flexible semiconductor device. Furthermore, while the flexibility of thin devices may not come into play as much in trench type implementations, the reduced height of the thinning may create significant advantages. For example, when there is more than one device stacked.

Device Aspects of Thinning—Relevance of Photon Effects

A number of principles and innovative concepts have been discussed in relationship to the thinning of semiconductor devices including their enhanced ability to be packed into small regions and their ability to be flexible, which thereby provides for a variety of novel embodiments and semiconductor placement on three-dimensional surfaces. Yet another aspect of thinning semiconductors may include how they may be altered by their interaction with light. As a result, in some exemplary embodiments, the interaction of light with the semiconductor devices may be used as an active aspect of their function. For example, when the devices are quite thin, their ability to sense light entering the back, (non-device) side of the semiconductor piece may be significantly improved. There may be a number of reasons for this. In general, the substrate when thick may itself be able to block light on the back of the substrate from making it to the front of the device. When thinned sufficiently, light particularly of wavelengths that are not absorbed significantly may traverse the substrate. The semiconductor doping level of the substrate may also affect the absorption characteristics. The doping level also modifies the distance that charge carriers created by light absorption may travel in the substrate may be modified. As substrates are thinned, all these factors are relevant to detecting a light signal that is incident on the back of the thinned semiconductor substrate. Another factor of relevance, is that on the front of the substrate where the devices are located are also the insulator and metallization levels. These levels have a high degree of interaction with incident light. Since, the backside of the substrate may not have these layers, again the ability to sense light through the back may be improved. Nevertheless, it may be possible to sense light through either one or both the front and the back surfaces when the substrate is sufficiently thinned Additionally, the nature of the geometry of the device compared to ambient light sources may enhance the effect for both flap and trench type implementations as they tend to have the most perpendicular profile to the expectable general direction of illumination.

From an opposite perspective, the ability of sensing photocurrents due to light incident on the back of the semiconductor devices may indicate that the same effect can occur in regions of the devices where the presence of a photocurrent may not be desired and may result in unintended issues affecting the performance of the semiconductor devices. As a result, in some exemplary embodiments it may be important to shield the thin devices. As a non-limiting example, the interconnection metallurgy may be used to shield out light. In some cases, the metallurgy may be portions of the interconnect lines. In other cases, the metal features may be placed for the sole function of blocking light from getting into the thinned device. It may also be useful, in some embodiments, to place metallurgy for the blocking of light wherein the metallurgy has windows or openings in it in regions where sensing the light is desired.

Reliability Aspects

In some exemplary embodiments, the thinned semiconductors disclosed herein may be formed of mono-crystalline substrates. As the substrate is thinned, the ability to deform without fracture of the crystalline substrate may become greater. Nevertheless, the substrate in some embodiments, especially when the degree of bending may be significant, may provide significant stress from the bending of flexing which may result in various effects in the device. Some of the types of effects in the device may result in various defect modes whose occurrence may be accelerated by the presence of the stress. An exemplary defect type may be a substrate related defect induced by stress.

Another exemplary defect type may relate to the metallization features that are placed on the semiconductor device. The metallization lines may be designed and qualified under standard conditions to carry a certain level of electrical current density before they experience the potential for early life failure due to effects like electromigration. In some cases, the introduction of bending stress may require additional methods to be followed for the design and production of the thin semiconductor devices.

Figure 10A:
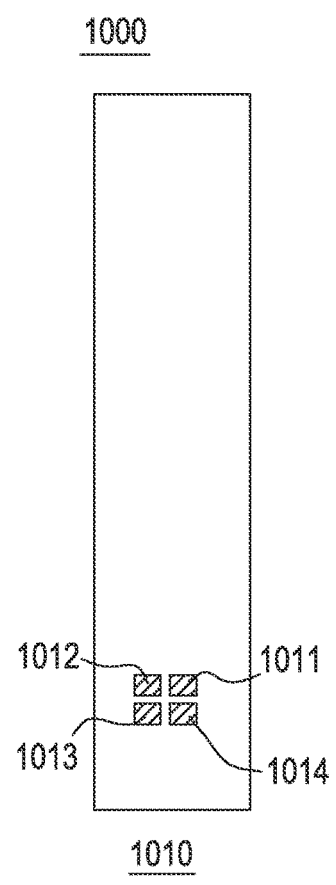
FIGS. 10A-10C illustrate exemplary circuit and circuit element reliability and design aspects thereof.
Figure 10B:
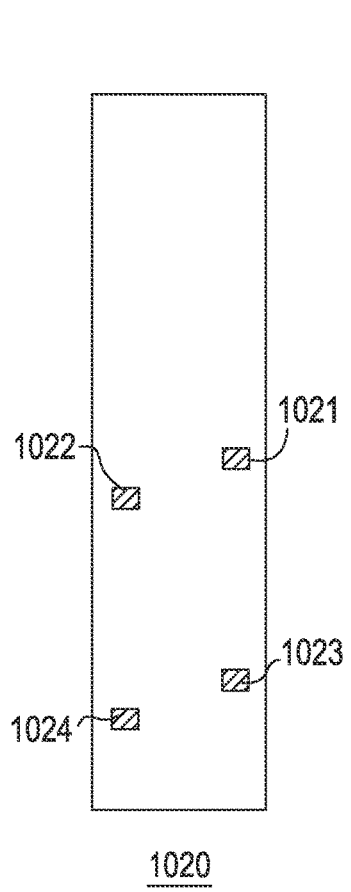
Figure 10C:
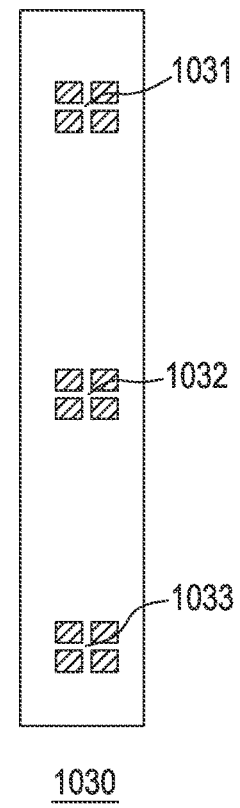

Numerous manners of altering design aspects in embodiments of thinned and flexible semiconductors may be possible to mitigate certain effects, including transistor matching, oxide stress, threshold voltage and the like. Referring now to FIGS. 10A-10C, at 1000 a number of exemplary approaches are illustrated. At 1010, a representation of redundancy is shown. Redundant copies of the same element (1011, 1012, 1013 and 1014) are depicted, where the element may be a single transistor, another circuit element, or a design block. In some exemplary embodiments, only one or two of the redundant elements may be used while in other embodiments, the redundant elements may be connected in parallel or series fashion to aid in resilience to stress induced defects.

At 1020, a representation of a different approach of achieving redundancy where the redundant elements (1021, 1022, 1023, and 1024) may be spatially separated is depicted. This approach may be useful if the type of defects propagate through the crystal lattice along crystal boundaries or otherwise would affect redundant features that are not isolated by distance. Yet another approach is depicted at 1030, multiple copies (1031, 1032, and 1033) of redundant elements at different locations along the thinned semiconductor device can be implemented.

Referring now to FIGS. 11A-11C, at 1100, examples of methods for designing in robustness to stress-induced defects in the metallurgy are shown. At 1110, a metal line 1111 on the thinned semiconductor device may be effective under normal conditions. In some exemplary embodiments where enough bending stress may occur to provide defect modes for metallurgy electromigration, one solution may include the method depicted in 1120. At 1121, a representation of the same electrical connection function, but in a line that is made wider than the original case is depicted. Such a solution would be effective for those modes where the reduction in current density by the additional cross sectional area may be helpful. Alternately, another approach is depicted at 1130 where multiple lines, 1131, 1132 and 1133 may be connected by crossing lines 1135. Such a network may offer resiliency to defects related to electrical current density (by increasing the effective cross section of conduction) as well as those related to defects that may be induced by the stress alone where redundant paths can be more important. There may be numerous manners of designing circuit aspects related to defect production by stress in flexed and bent thin semiconductor devices.

Helically Shaped Thin Semiconductor Pieces

Figure 12A:
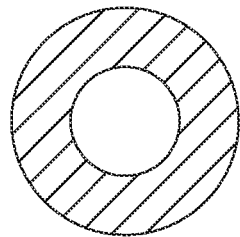
FIGS. 12A-12C illustrate an exemplary helical structure incorporated into an ophthalmic insert device.
Figure 12B:
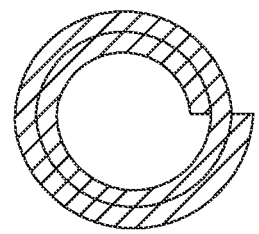
Figure 12C:
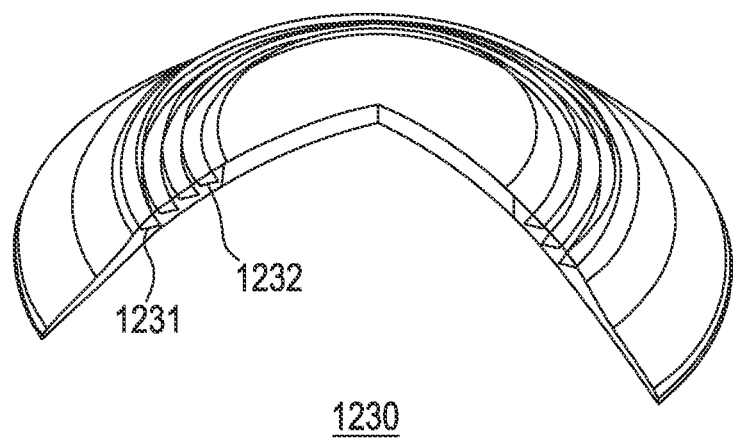

Referring to FIGS. 12A-12C, item 1200, another three-dimensional embodiment for the placement of semiconductors on substrates with three-dimensional shapes is shown. A thin piece of silicon may be manufactured in an annular shape at 1210. A dicing operation may cut out the thin piece of silicon into a complex curvilinear shape that while still flat may be a spiral shape at 1220. Now, the spiral shape may be attached to a three-dimensionally formed surface of an insert for example as may be seen at 1230. The three dimensionally formed surface may take the form of a helix. When the spirally shaped silicon piece is laid upon the helically shaped supporting surface, a relatively small and gentle stress may be imparted to the silicon substrate to cause it to assume the helical shape. Since the helical shape does cause the silicon to lift in space as it winds radially which may be seen by the change in vertical location that can be observed between 1231 and 1232, the resulting helix may better matched to the typical shape of an ophthalmic lens. The result may be an electronic component that assumes a three-dimensional shape of a helix with minimal stress imparted to the semiconductor substrate itself. The illustration at 1230 shows a single helical electrical component in concert with an insert piece that may be useful for inclusion into ophthalmic devices. In some exemplary embodiments, there may also be stacked implementations of helically shaped pieces and combinations of helical pieces that are attached onto the substrate.

The helical shape may have a benefit over trench type implementations in that multiple complete revolutions may fit in an insert device therefore allowing for more circuit area. In other ways, this embodiment may share similar aspects to the previous embodiments that have been mentioned, in how it may comprise a three-dimensional insert, how multiple devices of this type may be stacked, how the thinned semiconductor layer in this form may interact with light, and in how methods may be utilized to use redundancy or other stress compensating aspects of design. A spirally-diced semiconductor device may enable numerous ophthalmic embodiments when placed into inserts with helically shaped surfaces to support the diced semiconductor.

Specific examples have been described to illustrate aspects of inventive art relating to the formation, methods of formation, and apparatus of formation that may be useful to form functionalized elements, such as energization elements, upon electrical interconnects on three-dimensional surfaces. The examples are included to serve to provide enablement in conjunction with the description and are not intended to limit the scope in any manner. Accordingly, the present disclosure is intended to embrace all embodiments that may be apparent to those skilled in the art.

Although shown and described in what is believed to be the most practical and preferred embodiments, it is apparent that departures from specific designs and methods described and shown will suggest themselves to those skilled in the art and may be used without departing from the spirit and scope of the invention. The present invention is not restricted to the particular constructions described and illustrated, but should be constructed to cohere with all modifications that may fall within the scope of the appended claims.

What is claimed is:

1. An ophthalmic device comprising:
   an optical device component;
   a substrate insert having at least a surface region that is non-planar and forms at least a portion of a cylindrical shape contoured around at least a portion of a radial path of the optical device component;
   electrical contacts formed upon the surface region;
   at least a first electronic element attached to the electrical contacts, wherein the first electronic element comprises a thinned flexible semiconductor bent to conform to the surface region along the portion of the cylindrical shape.

2. The ophthalmic device of claim 1, wherein the electronic element is formed from a rectilinear-shaped material.

3. The ophthalmic device of claim 1, wherein the device includes a second electronic element spatially separated from and redundant to the first electronic element, wherein the first and second electronic elements are connected in parallel or series.

4. The method of claim 1, wherein the semiconductor comprises crystalline silicon, polycrystalline silicon, or amorphous silicon.

5. The ophthalmic device of claim 1 wherein the surface region and the first electronic element are housed within a media insert at a location defined by a mold feature formed between a front optic piece and a back optic piece of the media insert.

6. The ophthalmic device of claim 1 wherein the surface region is formed in a helical shape in three dimensions and wherein the thinned flexible semiconductor is bent in the third dimension to take on the helical shape of the substrate.

7. The ophthalmic device of claim 1 wherein cylindrical shape of the substrate insert has a radius of within about 7 mm and 9 mm.

* * * * *